THRESHOLD GATE

Filed June 29, 1964 2 Sheets-Sheet 1

INVENTOR.
THOMAS R. MAYHEW
BY John V. Regan
Attorney

INVENTOR.
THOMAS R. MAYHEW
BY John V. Regan
Attorney

United States Patent Office 3,317,753
Patented May 2, 1967

3,317,753

THRESHOLD GATE

Thomas R. Mayhew, Willingboro, N.J., assignor to Radio Corporation of America, a corporation of Delaware Filed June 29, 1964, Ser. No. 378,695
4 Claims. (Cl. 307—88.5)

This invention relates to threshold gates, and more particularly to the use of threshold gates in logic circuits.

A threshold gate, as the term is used herein, is a circuit which produces an output signal of one or another of two potential levels when the input signal level is respectively greater than, or less than, a predetermined threshold level. A threshold gate is termed a majority logic gate if the gate has an odd number of binary input signals applied thereto, and if the threshold level is set so that the gate produces an output at one binary level only when a majority of the binary input signals are at this same level. Alternatively, a threshold gate is termed a minority gate when the threshold level is set so that the gate produces an output at one binary level only when a minority of the binary input signals are at this same level.

It is important for the proper operation of a threshold logic gate that the gate exhibit an accurate threshold level; that the binary input signals be combined or summed accurately to provide a linearly increasing value for each additional signal; and, that the binary output signal levels be compatible with or accurately match the binary input signal levels.

Accordingly, it is an object of this invention to provide a new and improved threshold circuit.

It is another object of this invention to provide a threshold gate in which binary input signals are linearly combined.

It is a further object of this invention to provide a threshold gate in which the levels of the binary output signals match the levels of the binary input signals.

A threshold gate in accordance with the invention includes an active device such as a transistor having input, output, and common electrodes. An impedance summing network, for combining a plurality of binary input signals to provide a combined signal which increases substantially linearly with each additional signal, is connected to the input electrode of the active device to apply the combined signal thereto. Means are provided for establishing a threshold potential level at the common electrode of the active device so that the active device is rendered conductive when the combined signal exceeds the said threshold potential. Means are provided for deriving from the output electrode of the active device an output signal when the combined signal exhibits a predetermined relation to said threshold level.

Figure 1:
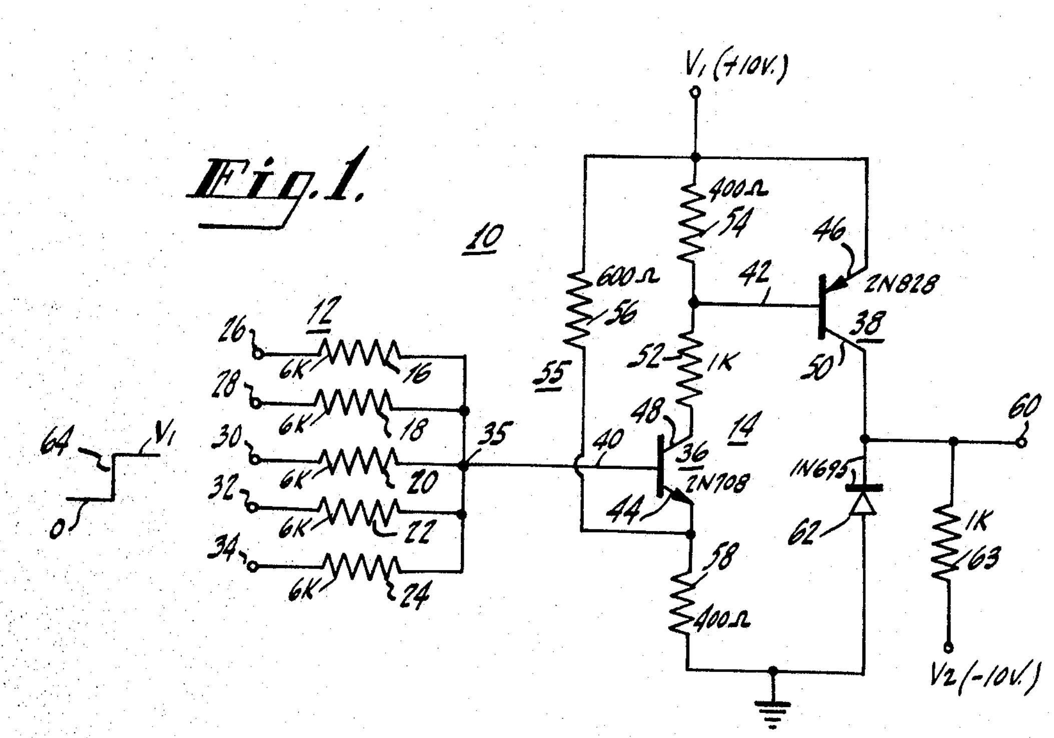
FIGURE 1 is a schematic circuit diagram of a threshold logic gate in accordance with the invention.

Referring now to FIGURE 1, a threshold logic gate 10, which functions as a majority gate, includes a linear summing or combining network 12. The network 12 linearly combines input signals to provide a combined signal which is compared with a threshold level established in a comparing or decision circuit 14. The network 12 comprises an impedance network which includes a plurality of resistors 16, 18, 20, 22 and 24 coupled, respectively, from input terminals 26, 28, 30, 32 and 34 to a summing point or junction 35. The resistors 16–24 are selected to be of substantially equal resistance. The threshold logic gate 10 may, for example, handle a greater number of input signals but for convenience of explanation only a five-input gate is illustrated in FIGURE 1.

The decision circuit 14 includes first 36 and second 38 transistors of opposite conductivity types. The first or NPN transistor 36 and the second or PNP transistor 38 include respective input base electrodes 40 and 42, respective common emitter electrodes 44 and 46, and respective output collector electrodes 48 and 50. The summing point 35 of the network 12 is directly connected to the input base electrode 40 of the first transistor 36 to apply the combined signal thereto. The first and second transistors are connected in cascade by coupling the output collector electrode 48 of the first transistor 36 through a current limiting resistor 52 to the input base electrode 42 of the second transistor 38. A source of potential $V_1$ is provided to energize the gate 10. The positive potential terminal of the source $V_1$ is connected directly to the emitter electrode 46 of the second transistor 38 as well as through a biasing resistor 54 to the base electrode 42 thereof. The transistor 38 is rendered nonconductive when no current flows through the biasing resistor 54 because both the base 42 and emitter 46 are at the same potential under this condition. Current flows through the biasing resistor 54 to turn on the second transistor 38 when the first transistor 36 is rendered conductive. Both the biasing resistor 54 and the current limiting resistor 52 connect the energizing source $V_1$ to the collector electrode 48 of the first transistor 36. The emitter 44 of the first transistor 36 is connected to an intermediate point of a voltage divider network 55 which includes the series combination of a pair of resistors 56 and 58. The voltage divider 55 is connected from the positive potential terminal of the energizing potential source $V_1$ to a point of common reference potential or circuit ground. The intermediate point on the voltage divider network 55 establishes a threshold potential level at the emitter 44.

An output terminal 60 is connected directly to the output collector electrode 50 of the second transistor 38. The collector 50 is also connected to the cathode of a diode 62, the anode of which is grounded. The cathode of the diode 62 is connected through a resistor 63 to the negative potential terminal of a power supply $V_2$. When the transistor 38 is not conducting, the output terminal 60 is clamped substantially to ground by the low impedance of the diode 62 which is forwardly biased by the power supply $V_2$. The low impedance of the forwardly biased diode 62 and the substantially constant and low voltage drop thereacross permits the gate 10 to exhibit a high "fan out" i.e., is capable of driving an appreciable number of other threshold circuits) without deviating substantially from ground potential. Ground potential level defines a signal of binary value of "0."

When the second transistor 38 is rendered conductive, it saturates and the output terminal 60 rises from zero or ground potential to the potential level $V_1$. Thus, a signal of the potential level $V_1$ is defined as a binary "1." The transistor 38 exhibits a low impedance when saturated and thus the gate 10 also exhibits a high "fan out" when operating at the high level as well as at the low level, as previously mentioned. The threshold potential established by the voltage divider 55 is selected so that when added to the voltage drop across the base-emitter junction of the first transistor 36, the sum is substantially equal ot one-half the potential $V_1$. For germanium transistors the base-emitter junction voltage drop is negligible and thus, the threshold potential is selected to be substantially one-half the voltage $V_1$. Silicon transistors exhibit a one volt drop across their base-emitter junction. Consequently, one volt less than $V_1$ is selected when utilizing such transistors.

Binary input signals 64 of either the "1" or the "0" values, i.e., $V_1$ or ground, are applied to each of the five input terminals 26–34 of the gate 10. When all binary "0" signals are applied, the summing point 35 exhibits a zero or ground potential level. Each individual binary "1" signal applied to the input terminal increases the voltage at the summing point 35 by an increment of $V_1/5$ until a majority of three or more binary "1" input signals applied to the summing network 12 cause the threshold level to be exceeded and the base-emitter junction of the first transistor 36 forwardly biased. The conduction of the first transistor 36 causes a voltage drop across the biasing resistor 54 which drives the second transistor 38 to saturation. The saturation of the transistor 38 reverse biases the diode 62 and raises the output terminal 60 voltage level from zero to substantially the potential $V_1$. Thus, the gate 10 functions as a majority gate to produce a binary output signal which matches the binary value of the majority of the input signals.

The current limiting resistor 52 is selected to limit the current through the first transistor 36 to a low value. This prevents heavy saturation of the second transistor 38 when all binary "1" signals are applied to the input terminals. If the transistor 38 is allowed to saturate deeply, the turn off time is undesirably increased. The limiting of the current through the transistor 36 also insures that the threshold level is maintained at substantially a constant value.

When binary "1" input signals are applied to only two of the input terminals, and consequently are not a majority of the input signals, the potential at the base 40 of the transistor 36 decreases below the threshold level and the first transistor 36 cuts off. Substantially no current flows through the biasing resistor 54 and the second transistor 38 is rendered nonconductive. The diode 62 then becomes forward biased and maintains the output terminal 60 at substantially ground potential or at the binary "0" level. Thus, the threshold gate 10 produces output signals at either ground level or the $V_1$ potential level when rendered nonconductive and conductive, respectively.

The power supply $V_1$ is common to a plurality of threshold gates identical to the gate 10 in logic systems. When the power supply $V_1$ fluctuates, the effect on the gate 10 is negligible for all but the largest fluctuations. For example, if the level of $V_1$ increases, the potential level of a binary "1" also increases. Consequently, the combined or sum signal at the summing point also increases a proportionate amount. However, the threshold potential level similarly increases proportionately. Thus, the effect of the power supply variation on the decision making ability of the gate 10 is minimized. The gate 10 also accurately maintains the output signals at either ground or $V_1$ potential levels and thus input signal levels are faithfully tracked even though the power supply $V_1$ fluctuates.

The decisions of the gate 10 are made by comparing a voltage with a voltage. The threshold level voltage is set accurately due to the linearity of the resistors 56 and 58. The combined signal voltage varies from zero to the potential $V_1$ in equal fractions of the potential $V_1$. Thus, the impedance in the impedance summing network 12 need not be selected to exhibit any particular absolute value of resistance. The combined signal voltage will increase incrementally and linearly for each additional binary "1" input signal as long as each of the impedances in the summing network 12 is equal in value. If the impedances are not equal, the sum signal does not increase in equal increments between an all binary "0" input signal condition and an all binary "1" input signal condition. It is therefore important that the impedances in the summing network 12 be made equal. However, the impedances in other networks 12 in different threshold gates may differ appreciably from those in the gate 10 without detrimentally affecting the operation of a logic system using these gates. The summing networks are independent of each other and do not have to exhibit resistance values of any particular absolute value.

It is to be noted that the threshold gate 10 includes only resistors and transistors therein. The transistors may be thin film transistors (TFT) or metal oxide semiconductor (MOS) transistors as well as the bipolar transistors described. Thus, it is apparent that the gate 10 is particularly adapted for fabrication into integrated circuits. In such fabrication techniques, the ability of the impedance networks 12 in different threshold gates to exhibit different values of the resistors may be important. It is much easier to make all the resistors equal in fabricating any one batch of resistors than it is to make resistors in two different batches equal. Moreover, in integrated circuits the resistors of a cluster are located over a relatively small area of the substrate and hence tend to have more uniform values since the small area is fairly independent of process variations. The values and types of components for a suitable threshold gate 10 are as indicated in FIGURE 1.

Figure 2:
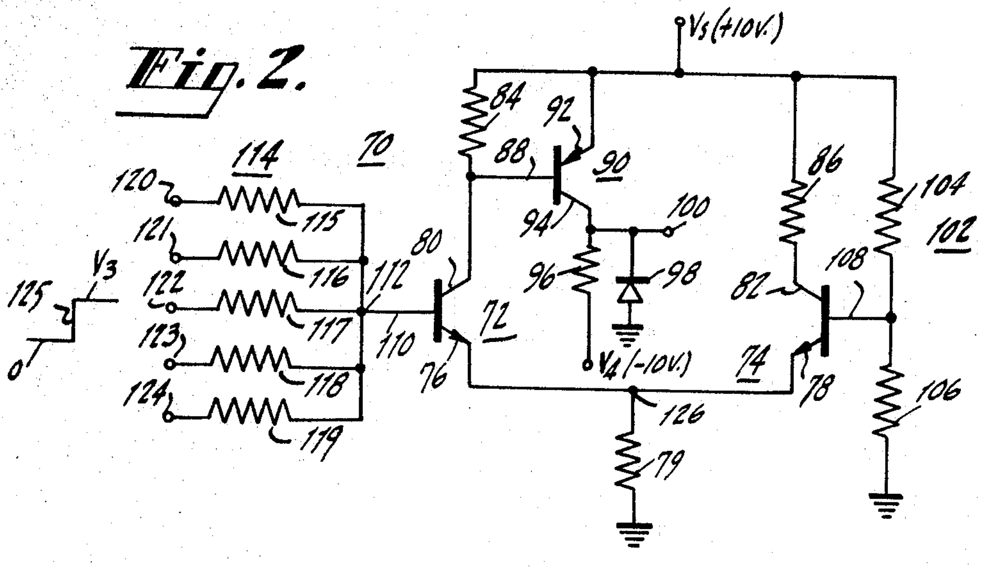
FIGURE 2 is a schematic circuit diagram of another embodiment of a threshold logic gate in accordance with the invention; and, FIGURE 3 is a schematic diagram of still another threshold logic gate which may be utilized either as a variable threshold level gate or as a majority gate.

Referring now to FIGURE 2, there is illustrated another embodiment of a threshold gate 70 in accordance with the invention. In the gate 70, a pair of like conductivity type transistors 72 and 74 are connected as a difference amplifier with their emitters 76 and 78, respectively, connected through a common resistor 79 to circuit ground and their collectors 80 and 82 connected through load resistors 84 and 86, respectively, to a power supply $V_3$. The transistors 72 and 74 are both illustrated as NPN type transistors.

The collector 80 of the transistor 72 is directly connected to the base 88 of an output PNP transistor 90. The emitter 92 of the output transistor 90 is connected directly to the positive potential terminal of the power supply $V_3$ while the collector 94 thereof is coupled to junction of a resistor 96 and a diode 98 serially coupled between ground and the negative potential terminal of a power supply $V_4$. The collector 94 also defines an output terminal 100 for the threshold gate 70.

A voltage divider 102, including the series combination of a pair of equal valued resistors 104 and 106, is connected from the positive potential terminal of the power supply $V_3$ to ground. The midpoint of the voltage divider 102 is connected to establish a threshold potential of one-half the power supply voltage $V_3$ at the base 108 of the transistor 74. The base 110 of the transistor 72 is connected directly to the summing point 112 of a resistor summing network 114. The network 114 includes a plurality of equal valued resistors 115 through 119 coupled, respectively, to a plurality of input terminals 120 through 124. Input signals 125 of either ground (zero) level or the $V_3$ potential level, corresponding respectively to a binary "0" and a binary "1," are applied to the summing network 114.

The potential level established by the voltage divider 102 at the base of the transistor 74 is the threshold potential of the gate 70. The threshold potential level minus the base-emitter voltage of the transistor 74 appears at the ungrounded terminal 126 of the common resistor 79 when the transistor 74 is conducting. The transistor 72 becomes forward biased when the base 110 thereof exceeds the potential at the terminal 126 by an amount equal to the base-emitter voltage thereof. Thus, the transistor 72 becomes forward biased when the combined input signal exceeds the threshold potential level.

If two or less binary "1" input signals are applied to the summing network 114, the transistor 72 is cut off but the transistor 74 is rendered conductive due to the bias established by the voltage divider 102. Thus current from the power supply $V_3$ flows through the transistor 74 and not through the transistor 72. The output terminal 100 is clamped to ground by the diode 100. Thus, the gate 70 output matches the majority of the binary input signals.

When three or more binary "1" input signals are applied to the summing network 114, the combined input signal exceeds the threshold potential level and forward biases the transistor 72 to conduction. The increased current through the resistor 79 drives the terminal 126 above the threshold potential and reverse biases the transistor 74 to cut off. Thus, the current from the power supply $V_3$ now steers through the transistor 72. The output transistor 90 is rendered conductive by the flow of current through the resistor 84 and the transistor 90 saturates. The saturation of the transistor 90 reverse biases the diode 98 and the output terminal 100 assumes the $V_3$ or binary "1" level. Thus, the gate 70 output matches the majority of the binary input signals.

The gate 70 may be transformed into a minority gate by disconnecting the base 88 of the transistor 90 from the collector 80 of the transistor 72 and instead connecting it to the collector 82 of the transistor 74. The conduction of the transistor 74 follows the minority of the binary input signals and by making the above suggested change, the output of the gate 70 would do so also.

The gate 70 exhibits added advantages over the gate 10 of FIGURE 1 in that the threshold potential established by the voltage divider 102 does not vary when the transistor 74 is cut off or conducting. The gate 70 also exhibits a greater immunity to power supply fluctuations because the threshold level is independent of the base-emitter voltage drops of the transistors 72 and 74. The gate 70 however exhibits the same immunity to summing network variations that the gate 10 of FIGURE 1 does.

Figure 3:
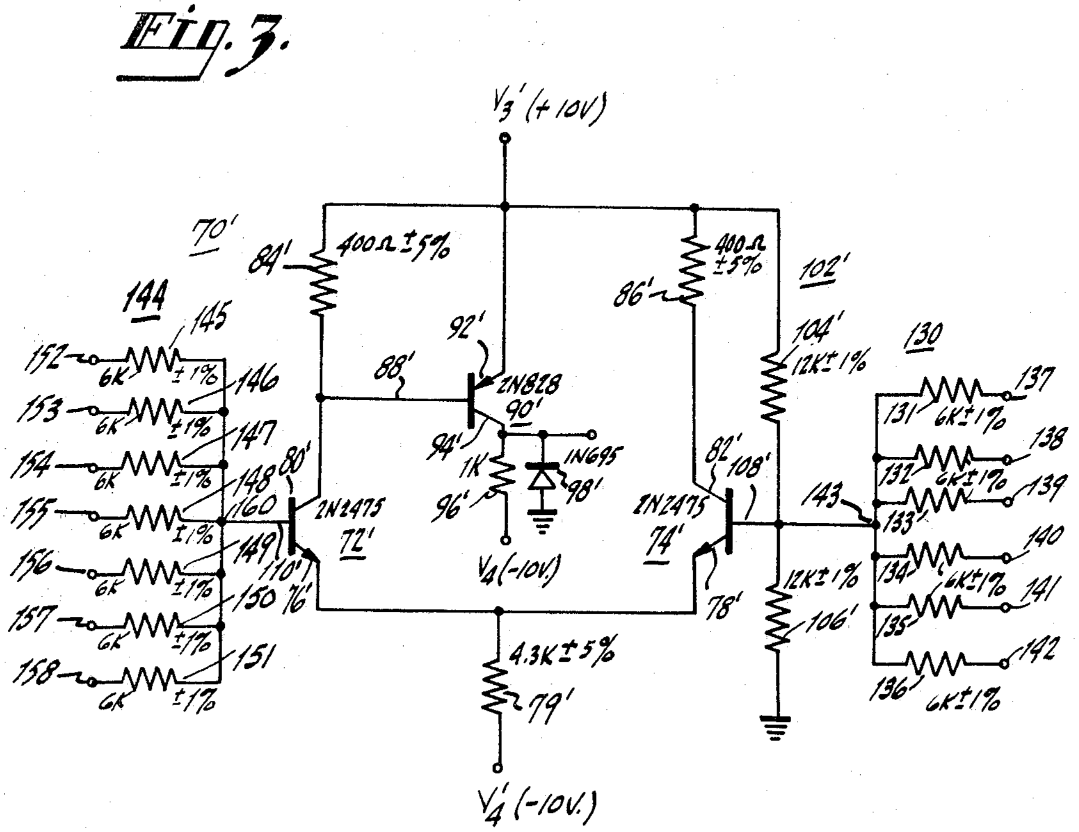

Referring now to FIGURE 3, a gate 70' is illustrated which may function either as a thirteen input majority-minority gate with seven normal and six inverted inputs or as a seven input threshold gate with a variable threshold level. In view of the similarities between the gates of FIGURES 2 and 3, the components of the gate 70' of FIGURE 3 are given the same but primed reference numerals as corresponding components in FIGURE 2.

The threshold level in the gate 70' is established not only by the voltage divider 102' but also by a resistive summing network 130. The network 130 includes a plurality, shown as six, of resistors 131 through 136 coupled, respectively, between a plurality of input terminals 137 through 142 and a summing point 143. The summing point 143 is connected directly to the base 108' of the transistor 74'. The values of each of the resistors 104 and 106' are selected to be twice the value of the resistors 131–136 in the summing network 130. A seven input resistive summing network 144 is also coupled to the transistor 72'. The network 144 includes a plurality of resistors 145 through 151 coupled, respectively, from input terminals 152 through 158 to a summing point 160. The summing point 160 is connected to the base 110' of the transistor 72'. The common resistor 79' is connected to the negative potential terminal of the power supply $V_4'$. Input signals of either ground potential or the $V_3'$ potential level are applied to each of the input terminals 137 through 142 and 152 through 158.

The summing point 143 of the network 130 and thus the threshold level of the gate 70' varies from one-fourteenth of the voltage $V_3'$ up to thirteenth-fourteenths of the voltage $V_3'$, in incremental steps of two-fourteenths of the voltage $V_3'$, when the input terminals 137 through 142 vary from all low (i.e., zero) to all high (i.e., all $V_3'$). The summing point 160 of the network 144 varies from zero to the voltage $V_3'$ in incremental steps of two-fourteenths of the voltage $V_3'$ as the input terminals 152 through 158 vary from all low to all high. Thus, the summing points 143 and 160 will always be offset or differ from each other by at least one-fourteenth of the voltage $V_3'$ so that there will be no indecision introduced into the gate 70'. The common resistor 79' is returned to the negative terminal of the power supply $V_4'$. Thus, the transistor 74' conducts even when zero level signals are applied to all of the input terminals in both the networks 130 and 144.

When operated as a thirteen input majority gate, normal signals, i.e., signals of one level, are applied to the input terminals 152 through 158 whereas inverted signals, i.e., signals of the other level, are applied to the input terminals 137 through 142. The output terminal 100' of the gate 70' produces a binary "0" output (i.e., ground output) when a majority of the input signals are binary "0's" and produces a binary "1" output (i.e., the voltage $V_3'$) when a majority of the input signals are binary "1's." It is to be recalled that the input signals applied to the network 130 are inverted.

If four binary "1" signals (which are inverted to low level signals by means not shown) are applied to the network 130, the threshold level at the summing point 143 exhibits the voltage value $\frac{5}{14}V_3'$. If three binary "1" signals are applied to the network 144, the voltage at the summing point 160 exhibits the value $\frac{6}{14}V_3'$. The threshold level is therefore exceeded by $\frac{1}{14}V_3'$ and the transistors 72' and 90' are rendered conductive to produce a binary "1" signal output from the terminal 100'. Thus, the output of the gate 70' follows the binary value of the seven binary "1" input signals which comprise a majority out of thirteen input signals. Alternatively, by coupling the base 88' of the transistor 90' to the collector 82' of the transistor 74', the gate will follow the binary value of a minority of the input signals. The gate 70' exhibits the same advantages as the gate 70 of FIGURE 2. Typical values of components for the gate 70' are shown in FIGURE 3.

What is claimed is:

1. A threshold gate, comprising in combination:

first and second transistors of the same conductivity type with each having input, output and common electrodes, an impedance device, means connecting said transistors in parallel by coupling said output electrodes to a first common point and by coupling said connom electrodes through said impedance device to a second common point in said gate, means for applying an energizing potential unconditionally across said transistors from said first common point to said second common point, means coupled to the input electrode of said second transistor to bias said transistor to conduction to establish a threshold potential at the common electrode of said first transistor, said threshold potential being of a polarity to render said first transistor nonconductive, an input summing network for combining a plurality of input signals to produce a combined signal that increases substantially linearly for each additional input signal, means coupling said input network to the input electrode of said first transistor to turn on said first transistor upon the application of input signals that create a combined signal potential greater than said first threshold potential, the conduction of said first transistor establishing a reverse bias potential at the common electrode of said second transistor that is the only reverse bias potential applied to said second transistor from said first transistor, and means for deriving from the output electrode of one of said transistors an output signal when said combined input signal exhibits a predetermined relation to said threshold potential.

2. A threshold gate in accordance with claim 1 wherein:

said input summing network includes an odd number of substantially equal valued resistors, and said output means is coupled to said first transistor to derive an output signal when a majority of said resistors have input signals applied thereto.

3. A threshold gate in accordance with claim 1 wherein:

said input summing network includes an odd number of substantially equal valued resistors, and said output means is coupled to said second transistor to derive an output signal when a minority of said resistors have input signals applied thereto.

4. A threshold gate in accordance with claim 1 that further includes:

a second input summing network coupled to the input electrode of said second transistor.

References Cited by the Examiner

UNITED STATES PATENTS

| | | | |
|---|---|---|---|
| 2,891,172 | 6/1959 | Bruce et al. | 307—88.5 |
| 3,043,511 | 7/1962 | Scott | 235—172 |
| 3,078,376 | 2/1963 | Lewin | 307—88.5 |
| 3,165,644 | 1/1965 | Clapper | 307—88.5 |
| 3,166,678 | 1/1965 | Fleshman et al. | 307—88.5 |
| 3,200,260 | 8/1965 | Fisk et al. | 307—88.5 |

OTHER REFERENCES

Clapper: Gated Comparison Circuit, IBM Technical Disclosure Bulletin, vol. 6, No. 9, February 1964, pp. 69, 70 relied on.

ARTHUR GAUSS, *Primary Examiner.*

I. C. EDELL, R. H. EPSTEIN, *Assistant Examiners.*